United States Patent [19]

Hallden-Abberton et al.

[11] Patent Number: 5,344,868
[45] Date of Patent: Sep. 6, 1994

[54] POLYGLUTARIMIDE/GLASS FIBER COMBINATIONS

[75] Inventors: Michael P. Hallden-Abberton, Maple Glen; William J. Work, Huntington Valley; Mark A. Abramowicz, Fairless Hills; Phuong N. Duong, Upper Darby, all of Pa.

[73] Assignee: Rohm and Haas Company, Philadelphia, Pa.

[21] Appl. No.: 36,121

[22] Filed: Mar. 23, 1993

[51] Int. Cl.$^5$ ................................................ C08K 3/40
[52] U.S. Cl. .................... 524/494; 524/188; 524/539; 524/540; 524/469
[58] Field of Search ............... 524/188, 494, 539, 540, 524/469

[56] References Cited

U.S. PATENT DOCUMENTS

| | | | |
|---|---|---|---|
| 4,246,374 | 1/1981 | Kopchik | 525/329 |
| 4,316,838 | 2/1982 | Tokuda | 524/469 |
| 4,727,117 | 2/1988 | Hallden-Abberton et al. | 525/343 |
| 5,004,777 | 4/1991 | Hallden-Abberton et al. | 524/433 |

FOREIGN PATENT DOCUMENTS

| | | | |
|---|---|---|---|
| 523497 | 7/1992 | European Pat. Off. | |
| 4175374 | 6/1992 | Japan | C08L 1/01 |

*Primary Examiner*—Kriellion S. Morgan
*Attorney, Agent, or Firm*—Roger K. Graham

[57] ABSTRACT

Glass-reinforced polyglutarimides exhibit improved impact resistance when low levels of phenoxy resin are incorporated into the blend.

14 Claims, No Drawings

POLYGLUTARIMIDE/GLASS FIBER COMBINATIONS

BACKGROUND OF THE INVENTION

1. Field of the Invention

This invention relates to an unexpected improvement found in the physical properties of glass-reinforced polyglutarimides when a low level of phenoxy resin is incorporated into the blend.

There exists a need for high softening (high glass temperature) glass-reinforced amorphous resins which also possess high modulus values (imparted by the glass) and acceptable impact strength for the various uses to which such resins might be put, such as in the electronics industry, where resistance to heat during assemblage and soldering is necessary, plus load-bearing capacity and ability to resist breakage on handling. Polyglutarimides, when glass-reinforced, have attractive properties for such a market, but additional toughness without the excessive loss in physical properties imparted by conventional impact modifiers is desirable. A solution to improvement of impact without loss in modulus properties and with only small decrease in softening temperature has been found with the addition of low levels of phenoxy resin to the polyglutarimide//glass combination.

2. Description of the Prior Art

Polyglutarimides, otherwise known as polymethacrylimides, are polymers which contain the unit

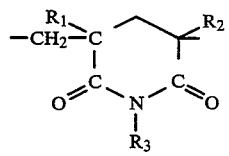

wherein $R^1$ and $R^2$ may be the same or different and are hydrogen or lower alkyl of up to four carbon atoms, such as methyl, ethyl, or butyl, and $R^3$ is H or alkyl, such as methyl, butyl, dodecyl, and the like. The polyglutarimides best known to the art are those where $R^1$ and $R^2$ are methyl and $R^3$ is hydrogen, methyl, other lower alkyl, or cyclohexyl. Particularly preferred are those polymers derived from poly(methyl methacrylate) and monomethylamine, where $R^1 = R^2 = R^3 =$ methyl.

Kopchik, U.S. Pat. No. 4,246,374 has described an efficient method for the production of such polyglutarimides in a continuous reactive extrusion process, although other methods, such as solution imidization, are known to the art. The Kopchik process, as well as all others known to the art, produce some residual acid and anhydride groups in the polyglutarimide if the extent of imidization is below about 95 percent of theoretical. Hallden-Abberton et al., U.S. Pat. Nos. 4,727,117 and 5,004,777, describe an acid-reducing or "capping" process for esterification or alkylation of such acid and anhydride groups to replace them by ester groups. These patents further describe the effect on compatibility with various resins between the "capped" and "uncapped" polyglutarimides.

Kopchik has described that polyglutarimides exhibit good acceptance of glass fiber reinforcement; such acceptance is maintained by the acid-reduced polymers of Hallden-Abberton.

Hallden-Abberton has published an extensive list of polymers which may be blended with the acid-reduced polyglutarimide, and has exemplified, among many others, a 50/50 blend with a phenoxy resin having a single glass temperature, indicative of compatibility, and being translucent in appearance.

The prior art reports blends of certain engineering resins, such as poly(butylene terephthalate), exhibit improved properties when the glass fiber surface is pre-coated with a phenoxy resin prior to blending.

There is no teaching or suggestion in the prior art that low levels of a specific resin (phenoxy resin) would be effective in raising the physical properties of glass-reinforced aliphatic polyglutarimides, especially when all organic components are directly compounded together in a single blend prior to addition of the glass fiber.

SUMMARY OF THE INVENTION

We have discovered a blend comprising:

a. From about 80 to about 99.5 parts, based on total polymer content, of a polyglutarimide as above defined, preferably containing N-methyl dimethylglutarimide units, and more preferably containing at least 60 weight percent of such glutarimide units in the polyglutarimide;

b. From about 0.5 to about 20 parts, based on total polymer content, of a phenoxy resin, preferably a phenoxy resin formed from the copolymerization of epichlorohydrin (1-chloro-2,3-epoxypropane) and bisphenol A (2,2-bis-(4-hydroxyphenyl)propane).

c. From about 10 to about 50 parts, preferably from about 20 to about 30 parts, based on the total weight of all components of the blend, of glass fiber.

The polyglutarimide may be prepared by the continuous extrusion process of Kopchik, or by the solution or heterogeneous imidization methods known to the art, or by imidization of an appropriate polymer containing glutaric anhydride units. Any level of imidization above about 5 percent is incorporated in the scope of the invention, although for the desired properties of high modulus, resistance to creep, and high service temperature, an extent of imidization at least 60% of theoretical is desirable. The polyglutarimide may also contain up to about 10 weight percent of methacrylic acid and/or methacrylic anhydride units, which units are formed during the reaction of poly(methyl methacrylate) with monomethylamine. A molecular weight of from above 50,000 to below 200,000 is preferred for ease of molding the final blend, but the invention is not restricted to that range of molecular weights.

The term "unit" as employed herein sometimes refers to units derived from the polymerization of the named chemical. One of ordinary skill in the polymerization arts would recognize that a "methacrylic acid unit" would refer to the unit in the polymer chain formed by the copolymerization of the methacrylic acid. It is more exactly a isobutyric acid unit, but it is known conventionally from its source. For the units formed in situ, such as the N-methyl dimethylglutarimide units, where there is no direct connection with a monomeric source, the actual structure-based name of the unit is employed.

The term "phenoxy resin" refers to polymers formed from the condensation of a bisphenol and a molecule containing a reactive halogen and an epoxy function. The bisphenol is a compound having two phenolic molecules linked by a group such as $-CH_2-$, $-C(CH_3$ )$_2$—, —SO$_2$—, and the like, the phenolic hydroxyl generally being in the 4-position relative to the linking group. Such molecules include isopropylidene diphenol, otherwise called bisphenol A or 2,2-bis-(4-hydroxyphenyl)propane; sulfonyl diphenol, otherwise called bisphenol S or bis-(4-hydroxyphenyl) sulfone; brominated or chlorinated bisphenols; and the like. The molecule containing a reactive halogen, usually an aliphatic-substituted halogen and an epoxy group, usually a chlorine, may be exemplified by epichlorohydrin, otherwise known as 1-chloro-2,3-epoxypropane; epibromohydrin (1-bromo-2,3-epoxypropane); and the like.

The polymer from the resultant condensation does not contain epoxy groups along the chain, but does contain epoxy and/or phenol groups at the chain ends. The molecular weight will vary depending on the method of polymerization. The phenoxy resins are articles of commerce, and may range from oligomers to high polymers.

Conventional glass fiber in strands, ropes, or cut pieces may be utilized. The preferred fiber is approximately about 9 to about 13 mm. in diameter and chopped to about 1/8" (3.2 mm) in length. Important to the best practice of the invention is the proper sizing of the polymer. Many sizings based on silane chemistry are known to the art, such as vinyltriethoxysilane, methacryloyloxypropyltrimethoxysilane, γ-glycidopropyltrimethoxysilane, γ-mercaptopropyltrimethoxysilane, aminosilanes, and the like. It is preferred that the glass fiber, prior to blending, is sized with a chemical which provides amino groups to the fiber surface. Such sizing may be done by the examiner or by the blender, preferably by the manufacturer. Although the manufacturer does not reveal what the sizing is, the recommendation of the particular fiber exemplified most often in this specification as a general-purpose fiber which should be useful with polyglutarimides leads the inventors to anticipate an aminosilane coating. It is believed difunctional materials containing a free amino group and a trialkoxysilane group are effective sizers for this purpose.

The glass is preferably in the form of a fiber, but microspheres, especially hollow microspheres, such as those supplied as Scotchlite® ™ glass bubbles, may be utilized. The invention further encompasses low-melting glasses such as those recently described in U.S. Pat. No. 4,940,677.

Although silica-based glass-fiber reinforcement is most efficacious in achieving the combination of toughness and high heat temperature, polyglutarimides may also be filled with other particulate materials. Those with surface functionality, such as hydroxy groups, may further be sized in a manner similar to sizing of glass. Other sizing materials specific to the functionality on the particulate material may also be employed, such as functionalized titanium compounds, thermally stable organic binders containing functional groups reactive with the particulate material functionality, and the like.

Both sized and unsized particulate materials with functionality, such as silica, mica, wollastonite, certain clays, alumina, and the like, may also be utilized in blends of polyglutarimides and a small amount of phenoxy resin to obtain improved interaction and thus improved properties for the filled blend.

Blending may be conducted with all ingredients in dry form and then fed to an extruder. The polyglutarimide may be blended with the glass and then the phenoxy resin added, or the phenoxy resin may be first blended with or coated onto the glass and the polyglutarimide added. Finally, the glass fiber may be supplied to the molten blend just prior to extrusion into sheet or pellets. Preferred is the method wherein the polyglutarimide, the phenoxy resin and optionally other additives, such as a flame retardant, are introduced into a plasticizing extruder, such as a partially intermeshing co-rotating extruder and the mixture compounded into a uniform polymer melt. Devolatilization of the melt may be carried out after good mixing is achieved. To the melt is then added chopped glass fiber, at the preferred level of about 10 to about 50% glass, more preferably 20–30%, (based on total weight of blend); the fiber is added by a side melt-addition feeder. The blend is then extruded through a die orifice, cooled, and chopped into pellets for subsequent re-molding or re-extrusion.

The blends process well and exhibit improved toughness and modulus over controls absent the phenoxy resin component. The resulting blends may be useful for such articles as boards for printed circuits which must resist the heat of soldering or fusion of electronic components. Other uses envisioned are tough, high-softening plastics for automotive, electronic, and construction materials, such as appliances, electronic housings, fuse housings, water pumps, piping, valves, other plumbing connections, load-bearing construction beams and structural members, toys, lighting housings, cartons, containers, automotive panels and bumpers, and the like.

The blends of the present invention may also contain other additives, such as lubricants, thermal stabilizers, ultraviolet light stabilizers, and the like. Flame retardants may also be employed, such as antimony oxide, organophosphorus compounds, and brominated aromatics. Use levels are preferably from about 10 to about 30 parts per 100 parts of all components. Particularly of interest is the blend wherein the brominated flame-retardant additive is formed by copolymerization of epichlorohydrin (1-chloro-2,3-epoxypropane) and tetrabromobisphenol A (2,2-bis-(4-hydroxy-2,3,5,6-tetrabromophenyl)propane).

EXAMPLES

EXAMPLE 1

This example describes the polyglutarimides used in the following blend examples. Imide A (T-240) is a polymer made by the method of Kopchik and reacted by the method of Hallden-Abberton to produce a polymer of MW ca. 120,000, 76.5% N-methyl dimethylglutarimide, ca. 23% methyl methacrylate, and below 0.5% methacrylic acid or methacrylic anhydride units. Imide B (T-260) is prepared similar but to a higher imide content of ca. 86% with ca. 13.5% methyl methacrylate units. Imide C is more fully imidized (ca. 95%), with again less than 0.5% acid or anhydride groups. All polyglutarimides contain a long-chain alcohol lubricant, a hydroxybenzotriazole light stabilizer, and an phosphite-based antioxidant. Imides A and B are commercially available polymers.

EXAMPLES 2–3

These examples describe the phenoxy resin and the glass fibers used in the following blend experiments. In these studies, the resin used was supplied by Union Carbide under the registered trademark UCAR. Various molecular weight resins may be used. Resin PKHC was used in Examples 4–7; it has a molecular weight of ca. 10,000 (number-average).

The chopped glass fiber is in most cases (Fiber A) 9 μm. diameter glass fiber chopped to 1/8 inch (3.2 mm.) length, supplied by Owens-Corning Fiberglas ® ™ as OCF 492-AA, recommended by the supplier for use with nylon and poly(ethylene terephthalate) resins, and believed to be surface treated to place amino groups at the surface by pre- reaction with gamma-aminopropyltriethoxysilane or a similar silane. Fiber B is similar but of 13 μm. diameter.

EXAMPLE 4

This experiment describes simple compounding experiments run to obtain properties. Physical blends of polyglutarimide, glass fibers, and phenoxy resin are compounded in a one-inch (25.4 mm.) Killion single-screw extruder at 100 rpm screw speed and a barrel set temperatures of 265–270 degrees C. Pellets are formed by extrusion, and those pellets then injection molded. Moldings are performed on a Newbury injection molding machine with an ASTM mold, operated at 100 rpm, which produces pieces suitable for testing of various properties under ASTM-defined conditions. Conditions were:

| | |
|---|---|
| Nozzle setting | 535° F. (280° C.) |
| Barrel zones (rear, #2, and #3) | 535° F. (280° C.) |
| Injection pressure | 425–500 psi (2.93 MPa–3.44 KPa) |
| Back pressure | 50 psi (345 KPa) |
| Injection time | 20 seconds |
| Cycle time | 40 seconds |
| Mold temperature | 330° F. (165° C.) |

Testing in all cases is by standard ASTM test methods for plastic materials. Falling Dart is a Dynatup test, and it is the maximum load that is reported. Tensile and flexural strength values are at break. Heat distortion temperatures are reported at two different loadings.

EXAMPLE 5

This Example reports the test values for Imide A, blended with from 0 to 8% (based on total polymer content) of phenoxy resin A and with 30% (based on total blend content) of glass fiber A. Increases in unnotched and notched Izod values reflect improvement in toughness, with the only property loss being in heat distortion temperature.

TABLE 1

Blends of Imide A, Phenoxy A, and Glass Fiber A (30% of total blend)

| Property | % Phenoxy | | | | |
|---|---|---|---|---|---|
| | 0 | 2 | 4 | 6 | 8 |
| Notched Izod, J/m | 76.9 | 84.4 | 95.6 | 107 | 107 |
| Unnotched Izod, J/m | 255 | 304 | 335 | 359 | 355 |
| Falling Dart, kg | 287 | 214 | 247 | 236 | 277 |
| Tensile strength, mPa | 180 | 172 | 172 | 173 | 173 |
| Flexural strength, mPa | 203 | 209 | 209 | 214 | 207 |
| Heat resistance, °C. | | | | | |
| .455 mPa (66 psi) | 143.6 | 142.8 | 141.1 | 139.8 | 137.0 |
| 1.82 mPa (264 psi) | 139.4 | 139.2 | 137.8 | 136.7 | 140.6 |

EXAMPLE 6

This Example reports the test values for Imide B, blended with from 0 to 8% (based on total polymer content) of phenoxy resin A and with 30% (based on total blend content) of glass fiber A. Increases in unnotched and notched Izod values reflect improvement in toughness, with the only property loss being in heat distortion temperature. Note also the improvements in tensile and flexural strength with addition of the phenoxy resin.

TABLE 2

Blends of Imide B, Phenoxy A, and Glass Fiber A (30% of total blend)

| Property | % Phenoxy | | | | |
|---|---|---|---|---|---|
| | 0 | 2 | 4 | 6 | 8 |
| Notched Izod, J/m | 59.3 | 87.6 | 99.3 | 103 | 101 |
| Unnotched Izod, J/m | 161 | 277 | 326 | 356 | 382 |
| Falling Dart, kg | 272 | 224 | 245 | 227 | 225 |
| Tensile strength, mPa | 146 | 160 | 170 | 170 | 168 |
| Flexural strength, mPa | 175 | 199 | 215 | 210 | 226 |
| Heat resistance, °C. | | | | | |
| .455 mPa (66 psi) | 153.4 | 151.8 | 151.4 | 149.4 | 147.4 |
| 1.82 mPa (264 psi) | 149.6 | 148 | 147.5 | 144.6 | 142.9 |

EXAMPLE 7

This Example reports the test values for Imide C, blended with from 0 to 8% (based on total polymer content) of phenoxy resin A and with 30% (based on total blend content) of glass fiber A. Increases in unnotched and notched Izod values reflect improvement in toughness, with the only property loss being in heat distortion temperature. Note also the improvements in tensile and flexural strength with addition of the phenoxy resin.

TABLE 3

Blends of Imide C, Phenoxy A, and Glass Fiber A (30% of total blend)

| Property | % Phenoxy | | | | |
|---|---|---|---|---|---|
| | 0 | 2 | 4 | 6 | 8 |
| Notched Izod, J/m | 51.8 | 83.8 | 92.9 | 93.4 | 94.5 |
| Unnotched Izod, J/m | 169 | 279 | 321 | 327 | 338 |
| Falling Dart, kg | 226 | 203 | 230 | 205 | 225 |
| Tensile strength, mPa | 132 | 153 | 159 | 161 | 166 |
| Flexural strength, mPa | 166 | 186 | 201 | 209 | 204 |
| Heat resistance, °C. | | | | | |
| .455 mPa (66 psi) | 169.6 | 168.6 | 166.7 | 166.1 | 165.4 |
| 1.82 mPa (264 psi) | 166.1 | 163.6 | 161.6 | 159.4 | 157.4 |

EXAMPLE 8

The example describes other polyglutarimides, phenoxy resins, and glass fibers examined in the following blend examples.

Imide D

This polyglutarimide is the precursor to Imide A, but the acid and anhydride groups have not been reacted to ester groups. It is a polymer made by the method of Kopchik from poly(methyl methacrylate) of MW 150,000, ca. 76.5 mol % N-methyl dimethylglutarimide units, ca. 5% methacrylic acid/methacrylic anhydride units, and ca. 19.5% methyl methacrylate units.

Imide E

This polyglutarimide is the precursor to Imide B, but the acid and anhydride groups have not been reacted to ester groups. It is a polymer made by the method of Kopchik from poly(methyl methacrylate) of MW 150,000, ca. 86 mol % N-methyl dimethylglutarimide units, ca. 5% methacrylic acid/methacrylic anhydride units, and ca. 9% methyl methacrylate units.

Imide F

This polyglutarimide is prepared similarly to Imides E and F, but has a molecular weight of ca. 90,000, ca. 50% mol % N-methyl dimethylglutarimide units, ca. 5% methacrylic acid/methacrylic anhydride units, and ca. 45% methyl methacrylate units.

Imide G

This polyglutarimide is made from poly(methacrylic acid) and ammonia by the method of Kopchik, U.S. Pat. No. 4,742,123, nitrogen content 8%; Vicat softening point 224 degrees C. A polyglutarimide containing both N-methyl and N-hydrogen substitution made by the method of Kopchik's '374 patent may also be used in the blend with glass fiber and phenoxy resin to produce the desired results.

Phenoxy Resin B

This resin is very similar to Phenoxy Resin A of Example 2, but is believed to be of slightly lower molecular weight.

Phenoxy Resin C

This resin is very similar to Phenoxy Resin A of Example 2 and to Phenoxy Resin B, but is believed to be of slightly lower molecular weight than the other resins.

Glass Fiber C

This material is a 9 μm. fiber with an unknown silane sizing, commercially designated OCF-408-BC, recommended for use with poly(butylene terephthalate, polycarbonate and polyacetal, nominal length 0.1875 inches (4.76 mm.).

Glass Fiber D

This material is a 9 μm. fiber with an unknown silane sizing, commercially designated OCF-497-DB, nominal length 0.125 inches (3.2 mm.)

Glass Fiber E

This material is a 9 μm. fiber with an unknown silane sizing, commercially designated OCF-497-EC.

EXAMPLES 9-25

In a similar manner, blends of imide, phenoxy resin, and glass fiber are prepared in the following ratios. As before, the level of phenoxy is the weight percent of the total polymer content, while the level of glass fiber is the weight percent of the total blend. The properties of the blends are similar to those reported above: an increase in toughness at all levels of phenoxy resin, maintenance or improvement of modulus properties, and a slight decrease in service temperature.

TABLE 4

| Example | Imide | Phenoxy (level) | Glass (level) |
| --- | --- | --- | --- |
| 9 | A | A (4,8) | A (30) |
| 10 | D | A (4,8) | A (30) |
| 11 | E | A (4,8) | A (30) |
| 12 | F | A (4,8) | A (20) |
| 13 | D | A (4,8) | A (20) |
| 14 | E | A (4,8) | A (20) |
| 15 | F | A (2,4,8) | A (20) |
| 16 | B | A (2,4,8) | A (30) |
| 17 | B | B (4,8) | A (30) |
| 18 | C | A (4,8) | A (30) |
| 19 | C | B (4,8) | A (30) |
| 20 | C | B (4,8) | C (30) |
| 21 | C | B (4,8) | D (30) |
| 22 | C | B (4,8) | E (30) |
| 23 | G | A (4,8) | A (30,40) |
| 24 | B | C | A (30) |
| 25 | C | C | A (30) |

EXAMPLES 26-32

In these examples, a brominated flame retardant is also present. It is a polymer of $M_w$ 20,000–50,000 which is a copolymer of tetrabromobisphenol A and epichlorohydrin, ca. 52–54% bromine.

TABLE 5

| Example | Imide | Phenoxy | Brominated Phenoxy | $Sb_2O_3$ | Glass |
| --- | --- | --- | --- | --- | --- |
| 26 | B | — | — | — | A (20) |
| 27 | B | — | A (13.4) | 6.6 | A (20) |
| 28 | B | — | A (16) | 8 | A (20) |
| 29 | C | — | A (17.5) | — | A (30) |
| 30 | C | 2.8 | A (17.5) | — | A (30) |
| 31 | F | — | A (24.5) | — | A (30) |
| 32 | F | 2.8 | A (24.5) | — | A (30) |

| Property | 26 | 27 | 28 | 29 | 30 | 31 | 32 |
| --- | --- | --- | --- | --- | --- | --- | --- |
| Notched Izod, J/m | 51.3 | 46.5 | 48.1 | 60.3 | 63.5 | 54.5 | 56.5 |
| Unnotched Izod, J/m | 200 | 153 | 156 | 182 | 183 | 169 | 191 |
| Falling Dart, kg | 196 | 184 | 198 | 175 | 194 | 133 | 165 |
| Flexural strength, mPa | 152 | 137 | 125 | 145 | 149 | 154 | 153 |
| Heat resistance, °C. | | | | | | | |
| .455 mPa (66 psi) | 147.7 | 146.4 | 147.9 | — | — | — | — |
| 1.82 mPa (264 psi) | — | — | — | 160.3 | 158.9 | 164.5 | 162.6 |
| Flammability | HB | V-O* | V-O | V-1 | V-1 | V-O | V-O |

*2 of 3 samples

Similar results will be obtained with brominated flame retardants which are not phenoxy resins, such as tribromostyrene, poly(pentabromophenyl acrylate),or a brominated epoxy resin similar to Additive A but oligomeric in nature and with free epoxy groups.

We claim:
1. A blend comprising:
   a. From about 80 to about 99.5 parts, based on total polymer content, of a polyglutarimide;
   b. From about 0.5 to about 20 parts, based on total polymer content, of a phenoxy resin;
   c. From about 10 to about 50 parts, based on the total weight of all components of the blend, of an inorganic fiber or particulate with functional surface groups.

2. The blend of claim 1 wherein the inorganic fiber or particulate is silica-based glass.

3. The blend of claim 2 wherein the silica-based glass is in the form of a fiber.

4. The blend of claim 1 wherein the polyglutarimide contains N-methyl dimethylglutarimide units.

5. The blend of claim 4 wherein the polyglutarimide contains at least 60 weight percent of N-methyl dimethylglutarimide units.

6. The blend of claim 5 wherein the polyglutarimide also contains up to about 10 weight percent of methacrylic acid and/or methacrylic anhydride units.

7. The blend of claim 1 wherein the phenoxy resin is that formed by copolymerization of epichlorohydrin (1-chloro-2,3-epoxypropane) and bisphenol A (2,2-bis-(4-hydroxyphenyl)propane).

8. The blend of claim 3 wherein the glass fiber is about 9 to about 13 μm. in diameter.

9. The blend of claim 1 wherein the inorganic fiber or particulate with functional surface groups, prior to blending, is sized with a silane or with a chemical which provides amino groups to the fiber surface.

10. The blend of claim 9 wherein the sizing chemical is an aminosilane.

11. The blend of claim 1 further containing a brominated aromatic flame-retardant additive.

12. The blend of claim 11 wherein the brominated aromatic flame-retardant additive is formed by copolymerization of epichlorohydrin (1-chloro-2,3-epoxypropane) and tetrabromobisphenol A (2,2-bis-(4-hydroxy-2,3,5,6-tetrabromophenyl)propane).

13. The blend of claim 1 wherein the polyglutarimide and the phenoxy resin are compounded together in a single molten blend prior to combination with the inorganic fiber or particulate with functional surface groups.

14. The blend of claim 11 wherein the polyglutarimide, the brominated flame retardant additive, and the phenoxy resin are compounded together in a single molten blend prior to combination with the inorganic fiber or particulate with functional surface groups.

* * * * *